United States Patent [19]

Iwase et al.

[11] Patent Number: 4,748,492
[45] Date of Patent: May 31, 1988

[54] READ ONLY MEMORY

[75] Inventors: Taira Iwase, Kawasaki; Shoji Ariizumi, Tokyo; Fujio Masuoka, Yokohama, all of Japan

[73] Assignee: Kabushiki Kaisha Toshiba, Kawasaki, Japan

[21] Appl. No.: 21,573

[22] Filed: Mar. 3, 1987

Related U.S. Application Data

[63] Continuation of Ser. No. 697,462, Feb. 1, 1985, abandoned.

[30] Foreign Application Priority Data

Feb. 3, 1984 [JP] Japan .................................. 59-17782

[51] Int. Cl.[4] ...................... H01L 29/78; H01L 27/02; H01L 29/34; H01L 23/48
[52] U.S. Cl. .................................... 357/59; 357/23.14; 357/41; 357/45; 357/54; 357/71
[58] Field of Search ........................ 357/23.1, 23.9, 41, 357/45, 46, 23.14, 59, 54, 71

[56] References Cited

U.S. PATENT DOCUMENTS

| | | | |
|---|---|---|---|
| 4,291,322 | 9/1981 | Clemens et al. | 357/59 |
| 4,322,824 | 3/1982 | Allan | 357/59 F |
| 4,341,009 | 7/1982 | Bartholomew et al. | |
| 4,372,031 | 2/1983 | Tsaur et al. | |
| 4,378,628 | 4/1983 | Levinstein et al. | 357/67 S |
| 4,403,394 | 9/1983 | Shepard et al. | 357/59 |
| 4,446,613 | 5/1984 | Beinglass et al. | 357/59 F |
| 4,476,482 | 10/1984 | Scott et al. | 357/59 |
| 4,516,147 | 5/1985 | Komatsu et al. | 357/59 |

FOREIGN PATENT DOCUMENTS

| | | |
|---|---|---|
| 0054163 | 12/1980 | European Pat. Off. . |
| 0068897 | 6/1982 | European Pat. Off. . |
| 58-27359 | 2/1983 | Japan . |

OTHER PUBLICATIONS

Masuoka, et al., "A New Mask ROM Cell Programmed by Through-Hole Using Double Polysilicon Technology," reprinted from Proceedings of the IEEE International Electron Devices Meeting (Dec. 1983), pp. 577-580.

*Primary Examiner*—J. Carroll
*Attorney, Agent, or Firm*—Finnegan, Henderson, Farabow, Garrett and Dunner

[57] ABSTRACT

A MOSFET read only memory is disclosed. A silicon material directly contacts a drain of a memory cell transistor formed in a silicon substrate to obtain a low contact resistance. A drain electrode layer partially covers two oxide films which are above a gate electrode, to increase a contact area between a metal wiring layer constituting an output line and the drain electrode layer.

4 Claims, 5 Drawing Sheets

F I G. 3
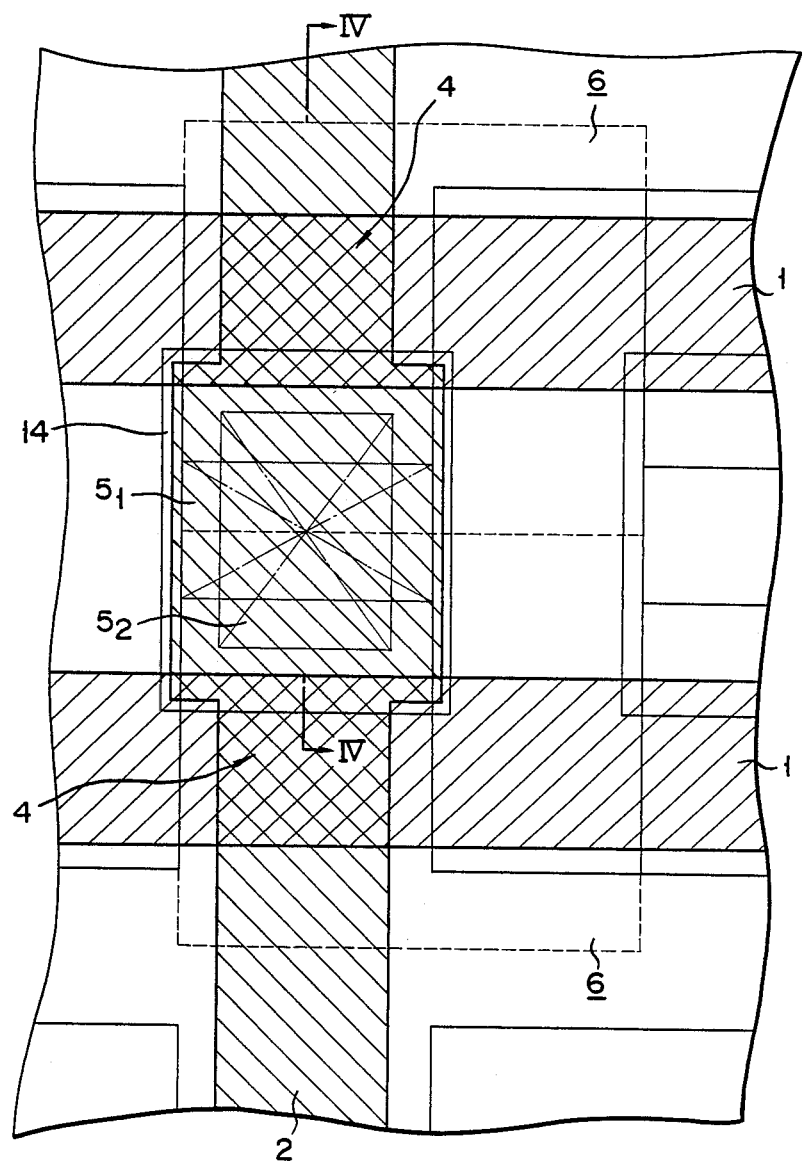

READ ONLY MEMORY

This application is a continuation of application Ser. No. 697,492 filed Feb. 1, 1985, abandoned.

BACKGROUND OF THE INVENTION

The present invention relates to a MOSFET (Metal Oxide Semiconductor Field Effect Transistor) type read only memory (ROM) and a method of manufacturing the same.

Data is written in a read only memory (ROM) during its manufacturing process. A ROM of this type is called a mask programmable ROM. Data writing is performed by (1) a contact method, (2) a field oxide method, or (3) a threshold voltage method. In the contact method, an output line is connected to or disconnected from the drain of a memory cell transistor to write data of logic "1" or "0". In the field oxide method, a gate oxide film is formed in a gate region of the memory transistor to write data of logic "1" or a field oxide film is formed to write data of logic "0". Finally, in the threshold voltage method, a threshold voltage is either increased or not increased to write data of logic "1" or "0".

According to the contact method, one contact is required for each memory cell. On the other hand, according to the field oxide and threshold voltage methods, only one contact is required for every two memory cells. In this sense, a memory size based upon the field oxide and the threshold voltage methods is smaller than that based upon the contact method.

FIG. 1 is a circuit diagram of a MOS type ROM, and FIG. 2 is a plan view showing part (i.e., a contact portion and its periphery) of the circuit of FIG. 1 which is prepared in accordance with the field oxide method. Reference numerals: 1 denotes gate wiring layers of memory cells 6; 2, ROM output lines; 3, ground lines; 4, MOS transistors each constituting the memory cell 6; and 5, contacts each connecting a given output line 2 and a corresponding memory cell 6. The gate wiring layer 1 comprises polysilicon, and the output line comprises aluminum.

As is apparent from the above in the field oxide method, only one contact 5 is required for every two memory cells 6. In contrast to the contact method, the field oxide method can decrease the memory size. The length of a memory cell is determined by the size of the contact 5 and a distance l between the gate wiring layer and the contact 5. When the contact 5 is decreased to a given size, the resistance of the contact portion is increased to a degree that cannot be disregarded. For this reason, reduction of the contact size is limited, thereby restricting decrease in the memory size.

SUMMARY OF THE IVENTION

The present invention has been made in consideration of the above situation, and has as its object to provide a read only memory and a method of manufacturing the same, wherein a contact between the memory cell and the output line is minimized.

According to the invention, there is provided a read only memory comprising a semiconductor substrate, source and drain regions formed in said substrate, a gate electrode formed on a first insulating film and in an area of said substrate between the source and drain regions, a drain electrode contacting the drain region so as to provide a low contact resistance and partially covering second and third insulating films which are above said gate electrode, and a wiring layer formed on said drain electrode.

BRIEF DESCRIPTION OF THE DRAWINGS

FIG. 3 is a plan view showing a pattern of part of a ROM according to an embodiment of the present invention.

DETAILED DESCRIPTION OF THE PREFERRED EMBODIMENT

Figure 1:
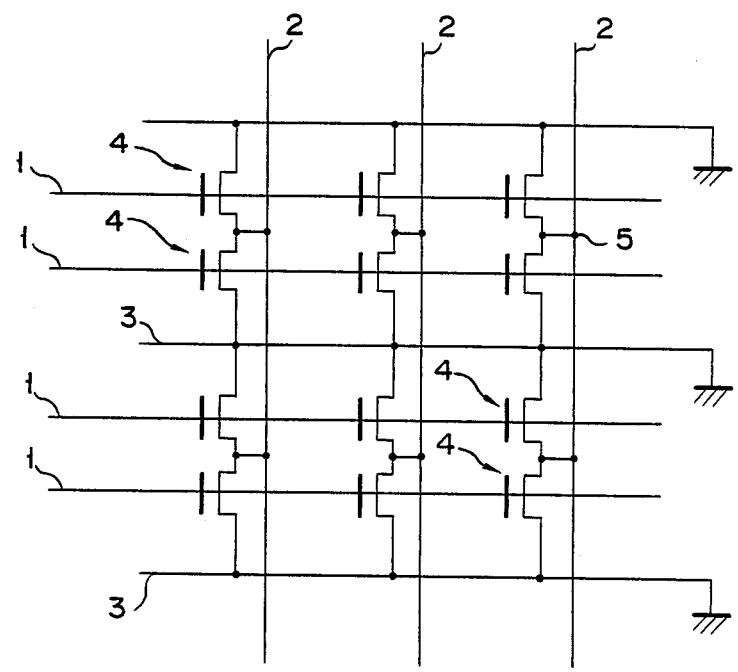
FIG. 1 is a circuit diagram of a conventional ROM.
Figure 2:
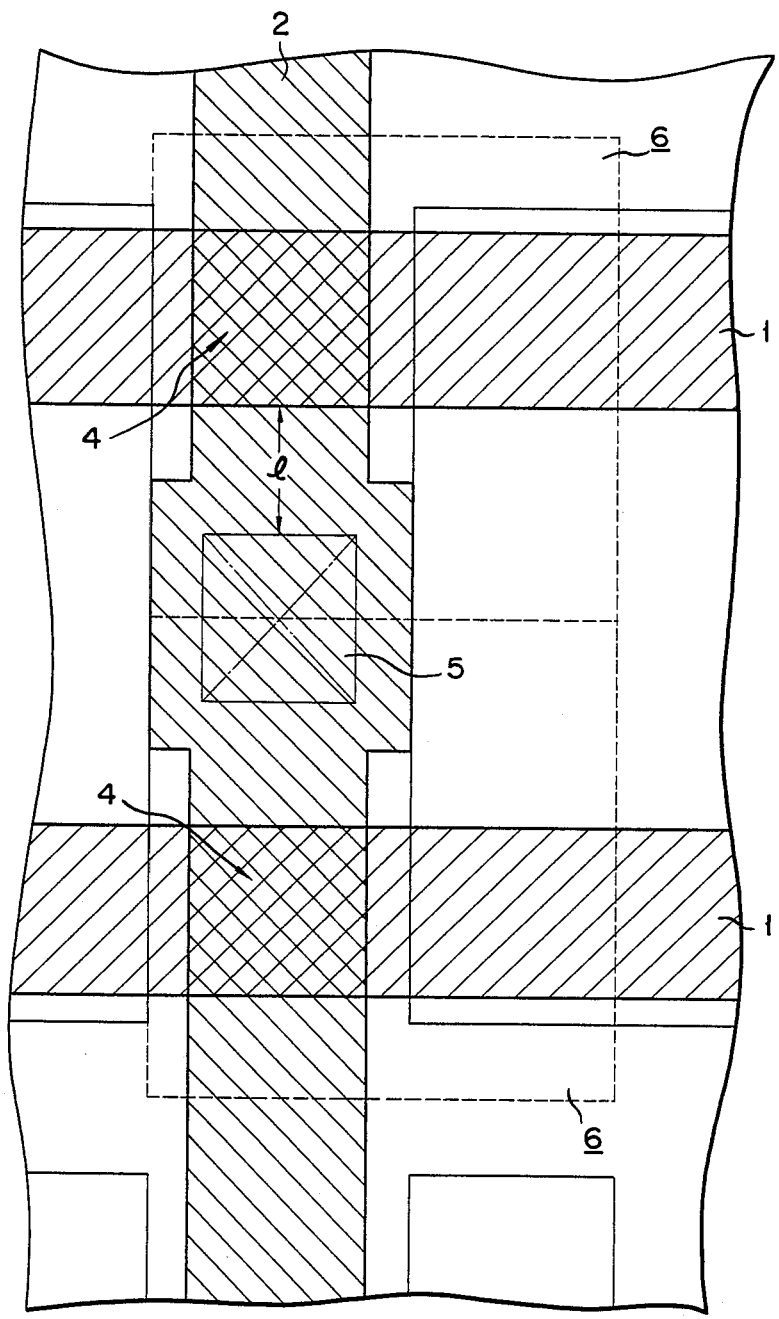
FIG. 2 is a plan view showing a pattern of part of the ROM shown in FIG. 1.

A ROM according to an embodiment of the present invention will be described with reference to FIGS. 3 and 4. FIG. 3 shows the surface pattern of the ROM, and FIG. 4 is a cross-sectional view of the ROM taken along the line IV—IV of FIG. 3.

Referring to FIG. 3, a gate wiring layer 1 is formed on each memory cell 6. A ROM output line 2 is formed on each memory cell 6 and extends perpendicular to each gate wiring layer 1. Reference numerals 4 denote transistors each constituting a memory cell; 14, a second polysilicon layer as a drain electrode layer (to be described with reference to FIG. 4); $5_1$, a contact between a drain region 12 (to be described with reference to FIG. 4) and the second polysilicon layer 14; and $5_2$, a contact between the second polysilicon layer 14 and the ROM output line 2.

Figure 4:
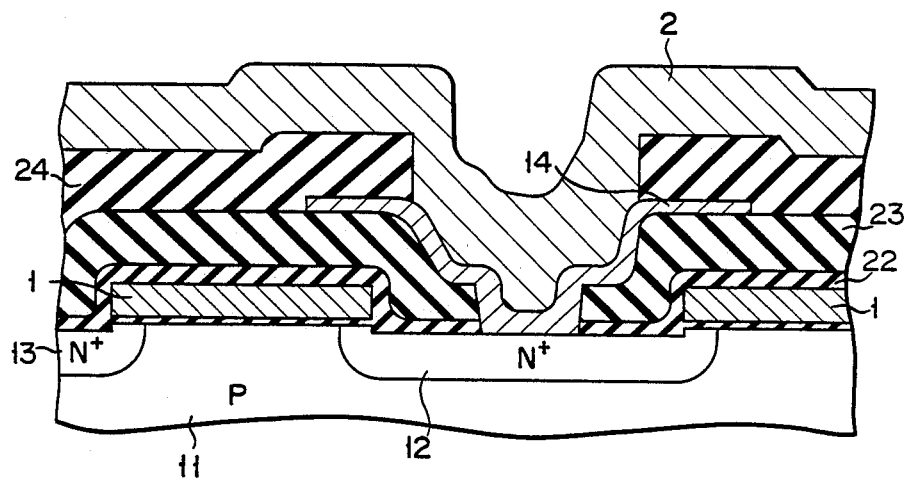
FIG. 4 is a cross-sectional view of the ROM taken along the line IV—IV of FIG. 3.

Referring to FIG. 4, a drain region 12 and the source region 13 of a MOSFET constituting a memory cell is formed in a silicon substrate 11 of p conductivity type. The drain and source regions 12 and 13 are of n+ conductivity type. A gate electrode layer 1 as a first polysilicon layer is formed on the substrate 11 through a gate oxide film 21 between the drain and source regions 12 and 13 respectively. Insulating films 22 and 23 are sequentially formed on the major surface of this structure. A contact hole is formed in the insulating films 22 and 23 to partially expose the drain region 12. The second polysilicon layer (drain electrode layer) 14 is formed on the insulating films 22 and 23. It extends to the drain region 12 through the contact hole. An insulating film 24 is formed on the second polysilicon layer 14. A contact hole is formed in the insulating film 24 to partially expose the second polysilicon layer 14. An aluminum wiring layer 2 as the ROM output line is formed on the insulating film 24 and extends to the polysilicon layer 14 through the contact hole. The aluminum wiring layer 2 covers the insulating films 22, 23 and 24.

In the above construction, since the drain region 12 of the transistor formed in the silicon substrate 11 directly contacts the polysilicon layer 14, the contact resistance is small. For this reason, the contact size can be decreased to reduce the memory cell size. The memory cell of the arrangement described above can be smaller by about 15% than the memory cell made by the conventional field oxide method (i.e., connecting the aluminum wiring layer to the drain region of the memory cell) or by an ion implantation method. In addition, a large contact area can be guaranteed between the aluminum wiring layer 2 and the second polysilicon layer 14.

Thus the contact resistance between the aluminum wiring layer 2 and the polysilicon layer 14 is low, which prevents degradation of transistor characteristics.

In this embodiment, the first polysilicon layer is used as the gate electrode of the transistor, and the second polysilicon layer is used to connect the aluminum wiring layer and the drain region. The gate electrode of the transistor may comprise a high-melting silicide film as a MoSi$_2$ film, a high-melting metal such as Mo, or a bilayered structure having a high-melting material layer and a polysilicon layer. Polysilicon is used to form the drain electrode layer (i.e., the second polysilicon layer 14). However, the drain electrode layer may comprise any material such as a high-melting metal silicide which provides a low contact resistance with the drain region 12. In the above embodiment, an n-channel MOSFET is formed in the substrate of p conductivity type. However, a p-channel MOSFET can be formed in a substrate of n conductivity type to obtain the same effect as in the above embodiment. Alternatively, a CMOS (Complementary Metal Oxide Semiconductor) device may be formed in a p- or n-well region. Furthermore, the substrate is not limited to a silicon substrate, but can be a GaAs substrate.

A method of manufacturing the ROM of FIG. 4 will be described with reference to FIGS. 5A to 5D.

Figure 5A:
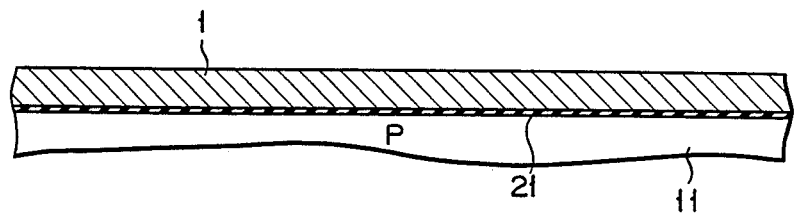
FIGS. 5A to 5D are respectively cross-sectional views for explaining the steps in manufacturing the ROM shown in FIG. 4.

Process 1 (FIG. 5A)

A field oxide film (not shown) having a predetermined pattern was formed by a local oxidation (LOCOS) technique on a p-type substrate or wafer 11 to a thickness of about 6,000 Å. A prospective element area of the substrate (or a wafer) 11 was exposed (an illustrated region). A field oxide film was either formed or not formed in the prospective gate region of the memory cell to write data in the field oxide method. In other words, when the field oxide film was formed data of logic "1" is written; when it was not formed data of logic "0" was written. FIG. 5A shows a state wherein data of logic "0" was written, i.e., the field oxide film was not formed. A gate oxide film 21 was formed by the thermal oxidation technique on the whole major surface of the wafer to a thickness of about 500 Å. However, if the ion implantation method had been used to write data, the field oxide film would have not been formed in the prospective gate region. Instead, a p-type impurity such as boron was ion-implanted in the gate region after the field oxide film (not shown), having the predetermined pattern, was formed. Specifically, to write data of logic "1", boron ions were implanted. Otherwise, boron ions were not implanted. A first polysilicon layer 1 was formed by an epitaxial growth technique on the whole major surface of the wafer to a thickness of about 4,000 Å.

Figure 5B:
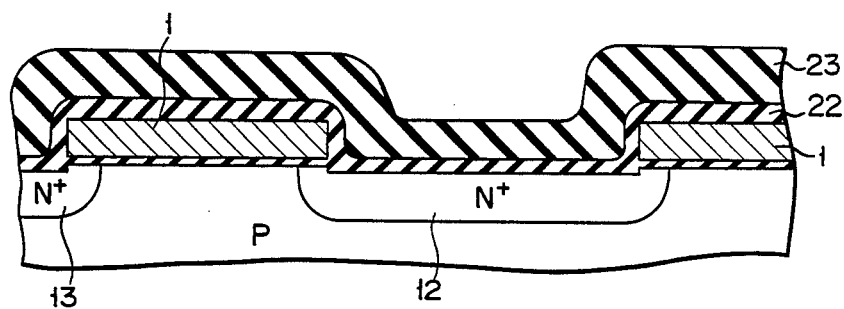

Process 2 (FIG. 5B)

The first polysilicon layer 1 was patterned by photoengraving techniques to form a gate electrode 1. An N-type impurity such as arsenic or phosphorus was ion-implanted in the wafer by using the gate electrode 1 as a mask, thereby forming n+-type layers 12 and 13 serving as the drain and source regions, respectively. A thermal oxide film 22 was formed by the thermal oxidation technique on the whole major surface of the substrate. According to the ion implantation method, instead of data writing in Process 1, a p-type impurity such as boron was or was not be ion-implanted to write data of logic "1" or "0". Thereafter, an oxide film 23 was formed by CVD (Chemical Vapor Deposition) on the whole major surface of the substrate.

Figure 5C:
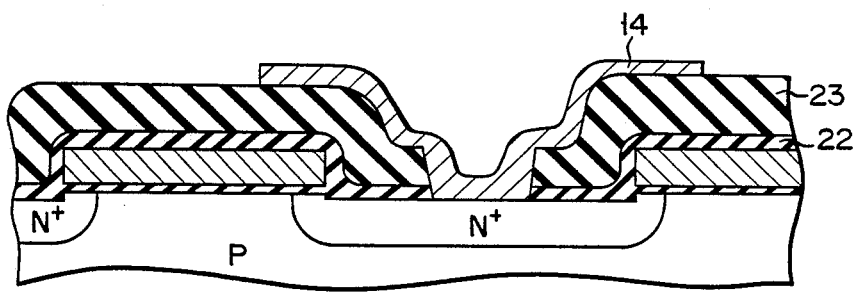

Process 3 (FIG. 5C)

A contact hole was formed by photoengraving techniques in the oxide films 22 and 23, thus partially exposing the drain region 12. A second polysilicon layer 14 was formed by the epitaxial growth on the whole major surface of the substrate to a thickness of about 3,000 Å, and was patterned by photoengraving. The patterned polysilicon layer 14 partially covered the oxide films 22 and 23 which were above the gate electrode 1. The second polysilicon layer 14 contacted the drain region through the contact hole formed in the oxide films 22 and 23 and served as the drain electrode. The polysilicon layer 14 comprised phosphorus- or arsenic-doped polysilicon, or it could be obtained by undoped polysilicon formation and then arsenic- or phosphorus-doping.

Figure 5D:
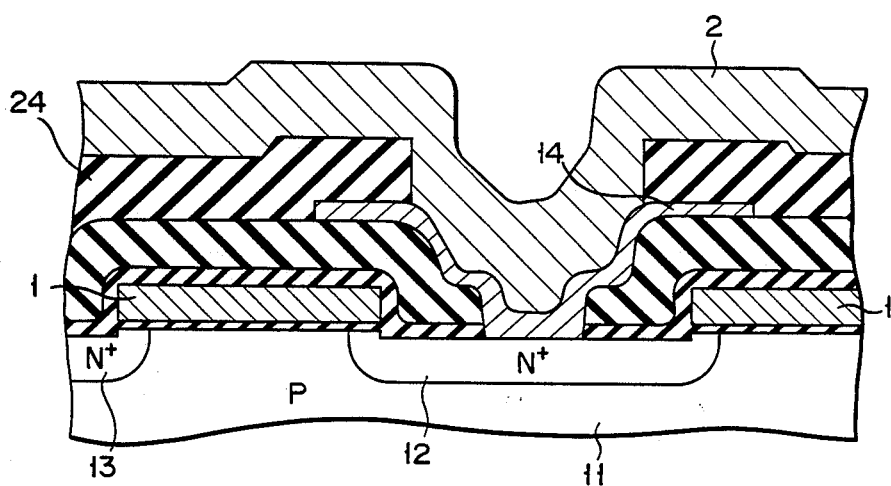

Process 4 (FIG. 5D)

An oxide film 24 was formed by CVD on the whole major surface of the substrate and was patterned by photoengraving to form a contact hole so as to partially expose the second polysilicon layer 14. An aluminum layer 2 serving as an output wiring layer was formed on the whole surface of the structure. The aluminum layer 2 contacted the polysilicon layer 14 through the contact hole formed in the oxide film 24. The aluminum layer 2 was patterned by photoengraving, thus obtaining a predetermined pattern. As a result, the ROM shown in FIG. 4 is prepared.

According to the present invention, there are provided a read only memory and a method of manufacturing the same, wherein a memory cell size can be decreased as compared with the conventional case, and the elements have good electrical characteristics.

What is claimed is:
1. A read-only memory comprising:
   a semiconductor substrate;
   a pair of MOS transistors each having a separate source region and a common drain region;
   a gate insulation film for each of said MOS transistors formed on said semiconductor substrate;
   a gate electrode for each of said MOS transistors formed on said gate insulation film;
   a first insulation film formed on said gate electrode for each of said MOS transistors;
   a second insulation film formed on said first insulation film of each of said MOS transistors gate electrodes, said first and second insulation films defining a first contact hole leading to said common drain region;
   a common drain electrode extending in said first contact hole and contacting said common drain region, said common drain electrode having an extended portion lying on said second insulation film above said gate electrode of each of said MOS transistors;
   a third insulation film formed on said extended portion of said common drain electrode above said gate electrode for each of said MOS transistors, said third insulation film defining a second contact hole above said first contact hole; and
   a conductive layer formed on said common drain electrode and said third insulation film, said conductive layer extending in said second contact hole and contacting said common drain electrode.

2. A memory according to claim 1, wherein said semiconductor substrate comprises a silicon substrate, and said common drain electrode comprises polycrystalline silicon.

3. A memory according to claim 2, wherein polycrystalline silicon of said common drain electrode contains an impurity.

4. A memory according to claim 1, wherein said common drain electrode comprises a high-melting metal silicide.

* * * * *